(12) United States Patent
Yu et al.

(10) Patent No.: US 9,837,927 B2
(45) Date of Patent: Dec. 5, 2017

(54) POWER SUPPLY DEVICE AND A SYNCHRONOUS RECTIFIER PCB

(71) Applicants: LITE-ON ELECTRONICS (GUANGZHOU) LIMITED, Guangzhou (CN); LITE-ON TECHNOLOGY CORP., Taipei (TW)

(72) Inventors: Wei-Cheng Yu, Taipei (TW); Chi-Che Wu, Taipei (TW); Liang-Hong Wang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 20 days.

(21) Appl. No.: 14/960,603

(22) Filed: Dec. 7, 2015

(65) Prior Publication Data
US 2016/0094147 A1   Mar. 31, 2016

Related U.S. Application Data

(63) Continuation of application No. 13/849,636, filed on Mar. 25, 2013, now Pat. No. 9,231,480.

(30) Foreign Application Priority Data

Apr. 24, 2012   (CN) .......................... 2012 1 0126043

(51) Int. Cl.
*H02M 3/335* (2006.01)
*H02M 7/217* (2006.01)
(Continued)

(52) U.S. Cl.
CPC ............. *H02M 7/217* (2013.01); *H02M 1/08* (2013.01); *H02M 1/14* (2013.01); *H02M 1/34* (2013.01); *H02M 3/335* (2013.01); *H02M 3/33507* (2013.01); *H02M 3/33592* (2013.01); *H05K 1/092* (2013.01); *H05K 1/111* (2013.01);
(Continued)

(58) Field of Classification Search
CPC  H05K 1/14; H05K 1/141; H05K 1/02; H05K 1/0203; H05K 1/117; H02M 3/33592; H02M 2001/348

See application file for complete search history.

(56) References Cited

U.S. PATENT DOCUMENTS 6,262,905 B1 *   7/2001   Zhang ................... H02M 7/217
                                                        323/225
2006/0268585 A1 *  11/2006  Domb ..................... H02M 1/34
                                                        363/21.06
(Continued)

*Primary Examiner* — Harry Behm
(74) *Attorney, Agent, or Firm* — Rosenberg, Klein & Lee

(57) ABSTRACT

A power supply device includes a main unit and a power switching module. The main unit includes a primary circuit board, a transformer including a primary and a secondary coil, a primary-side circuit and a secondary-side circuit. The power switching module includes a separate PCB formed with at least two connection pads and two conductive tracks, and at least one power switching element disposed on the PCB and having two terminals respectively connected to the two connection pads through the two conductive tracks. The power switching module is in the form of a separate PCB that is electrically connected to the primary- or secondary-side circuits through the two connection pads.

5 Claims, 5 Drawing Sheets

(51) Int. Cl.
  *H02M 1/08*  (2006.01)
  *H02M 1/14*  (2006.01)
  *H05K 1/09*  (2006.01)
  *H05K 1/18*  (2006.01)
  *H05K 1/11*  (2006.01)
  *H05K 1/14*  (2006.01)
  *H05K 1/02*  (2006.01)
  *H02M 1/34*  (2007.01)
  *H02M 1/00*  (2006.01)

(52) U.S. Cl.
  CPC ..... *H05K 1/181* (2013.01); *H02M 2001/0048* (2013.01); *H02M 2001/348* (2013.01); *H05K 1/0203* (2013.01); *H05K 1/117* (2013.01); *H05K 1/141* (2013.01); *H05K 2201/0355* (2013.01); *H05K 2201/10166* (2013.01); *Y02B 70/1475* (2013.01)

(56) References Cited

U.S. PATENT DOCUMENTS

| | | | |
|---|---|---|---|
| 2008/0170418 A1* | 7/2008 | Nishiyama | H02M 3/337 363/17 |
| 2009/0161326 A1* | 6/2009 | Lin | G06F 1/26 361/752 |
| 2009/0219124 A1* | 9/2009 | Young | H01F 3/10 336/65 |

* cited by examiner

POWER SUPPLY DEVICE AND A SYNCHRONOUS RECTIFIER PCB

CROSS-REFERENCE TO RELATED APPLICATION

This application is a continuation application of U.S. patent application Ser. No. 13/849,636 filed on Mar. 25, 2013, the contents of which are hereby incorporated by reference in their entirety. This application further claims priority of Chinese Patent Application No. 201210126043.5, filed on Apr. 24, 2012.

BACKGROUND

1. Field of the disclosure

This disclosure relates to a power supply device, more particularly to a power supply device with a power switching module in the form of a separate PCB (printed circuit board) that is able to be welded to or plugged removably into a primary circuit board such that the power switching module forms a non-zero angle with the primary circuit board.

2. Description of the Related Art

In a conventional power supply device, there are two power switching elements (e.g. MOSFETs) provided in a synchronous rectifier circuit of a secondary-side circuit of a transformer. Such power switching elements will generate a significant amount of heat during operation. As shown in FIG. 1, the general solution to dissipate the heat is to fasten the power switching elements 11, 12 on two opposite surfaces of a heat dissipating element 15 by a screw 13 and a nut (not shown), in which the screw 13 passes through an exposed metal portion 14 of each of the power switching elements 11, 12, thereby dissipating the heat generated by the power switching elements 11, 12 through the heat dissipating element 15. However, this solution requires that a piece of insulator 16 be placed between the heat dissipating element 15 and each of the power switching elements 11, 12, and that an insulator 17 smeared with a heat-dissipating paste be placed between the exposed metal portion 14 of each of the power switching elements 11, 12 and the respective screw 13 or nut so as to prevent the exposed metal portion 14 from being shorted with the heat dissipating element 15, making the procedure complicated, labor-consuming and costly.

SUMMARY OF THE DISCLOSURE

One object of the disclosure is to provide a synchronous rectifier printed circuit board that is capable of overcoming the aforesaid drawbacks of the prior art.

According to one embodiment of this disclosure, a synchronous rectifier printed circuit board (PCB) is to be connected to a main unit of a power supply device. The main unit includes a transformer that includes a primary coil, a secondary coil, a primary-side circuit electrically coupled to the primary coil, and a secondary-side circuit electrically coupled to the secondary coil. The secondary-side circuit includes an output filter circuit capable of filtering out ripples in a direct-current (DC) voltage.

The synchronous rectifier PCB includes a printed circuit board, two power switching elements, two driving circuits, and two snubbers.

The power switching elements are disposed on the printed circuit board. Each of the power switching elements has a source terminal, a gate terminal and a drain terminal.

The driving circuits are disposed on the printed circuit board, and are electrically and respectively coupled to the gate terminals of the power switching elements.

The snubbers are disposed on the printed circuit board. Each of the snubbers is electrically coupled between the drain and source terminals of a corresponding one of the power switching elements.

The synchronous rectifier PCB is electrically coupled between the secondary coil of the transformer and the output filter circuit for synchronously rectifying an alternating-current (AC) voltage induced at the secondary coil into a direct-current (DC) voltage to be subsequently outputted to the output filter circuit.

BRIEF DESCRIPTION OF THE DRAWINGS

Other features and advantages of the disclosure will become apparent in the following detailed description of the preferred embodiment of this disclosure, with reference to the accompanying drawings, in which.

DETAILED DESCRIPTION OF THE PREFERRED EMBODIMENT

Figure 1:
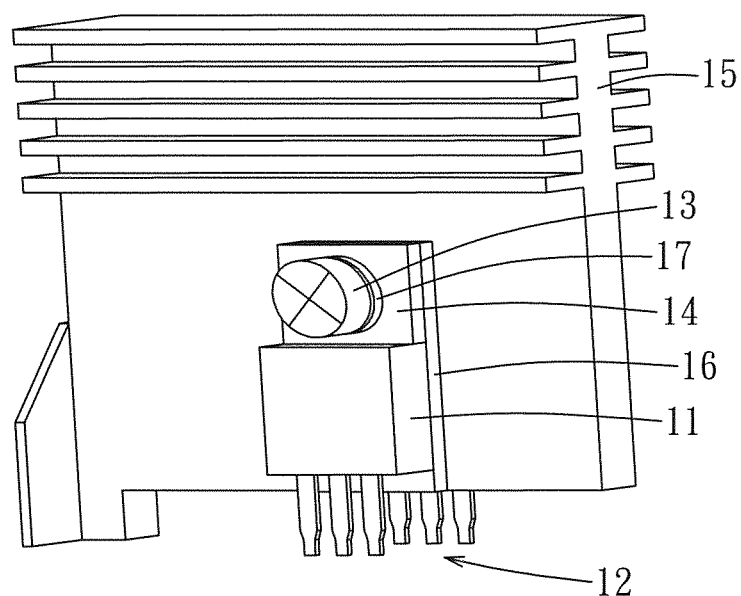
FIG. 1 is a perspective view illustrating a conventional way of securing two power switching elements onto a heat dissipating element.

Before the disclosure is described in greater detail, it should be noted that like elements are denoted by the same reference numerals throughout the disclosure.

Figure 2:
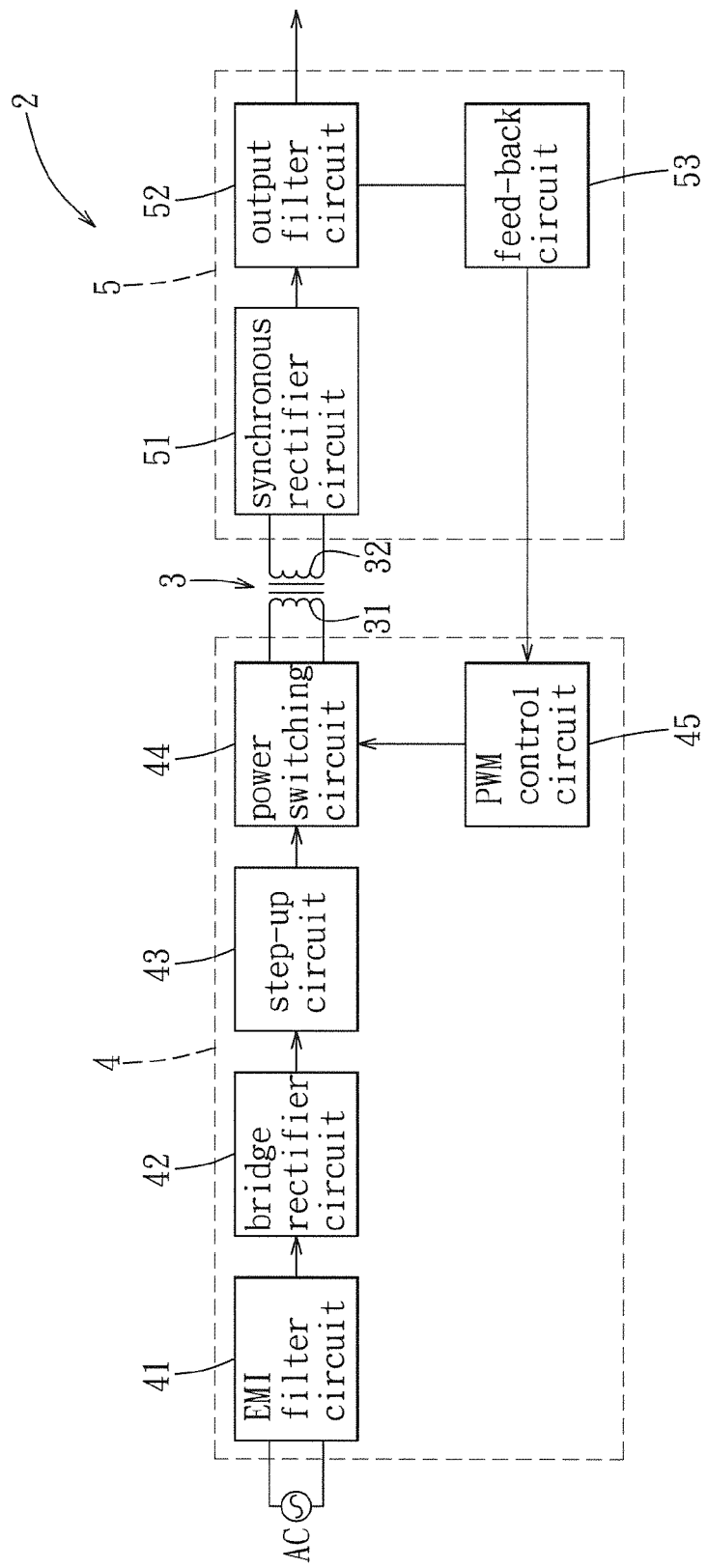
FIG. 2 is a block diagram of a power supply device according to the preferred embodiment of the disclosure.

Referring to FIG. 2, a power supply device 2 according to the preferred embodiment of the disclosure includes a transformer 3 that includes a primary coil 31 and a secondary coil 32, a primary-side circuit 4 that is electrically coupled to the primary coil 31 of the transformer 3 and a secondary-side circuit 5 that is electrically coupled to the secondary coil 32 of the transformer 3.

The primary-side circuit 4 includes an electromagnetic interference (EMI) filter circuit 41 for filtering differential-mode and common-mode noises from an inputted alternating current (AC) signal, a bridge rectifier circuit 42 electrically coupled to the EMI filter circuit 41 for performing full-wave rectification on the filtered AC signal to generate a direct current (DC) pulse voltage, a step-up circuit 43 electrically coupled to the bridge rectifier circuit 42 for performing a step-up conversion on the DC pulse voltage to output a high voltage (about 380V), a power switching circuit 44 electrically coupled to the step-up circuit 43 and to the primary coil 31 of the transformer 3, driven by the high voltage for exciting the primary coil 31 to induce an AC voltage at the secondary coil 32 of the transformer 3, and a pulse-width modulation (PWM) control circuit 45 electrically coupled to the power switching circuit 44 for controlling the turn-on period of the power switching circuit 44.

The secondary-side circuit 5 includes a synchronous rectifier circuit 51 that is electrically coupled to the secondary coil 32 of the transformer 3 and that is configured for synchronously rectifying the AC voltage induced at the secondary coil 32 into a DC voltage, an output filter circuit 52 electrically coupled to the synchronous rectifier circuit 51 for filtering out ripples in the DC voltage, and a feed-back circuit 53 that is electrically coupled to the output filter circuit 52 for receiving the filtered DC voltage therefrom, and that is further electrically coupled to the PWM control circuit 45 of the primary-side circuit 4 for outputting a control signal thereto through a coupler (not shown) for controlling the PWM control circuit 45 to control the turn-on period of the power switching circuit 44, thereby facilitating output of a stable DC voltage by the synchronous rectifier circuit 51.

Figure 3:
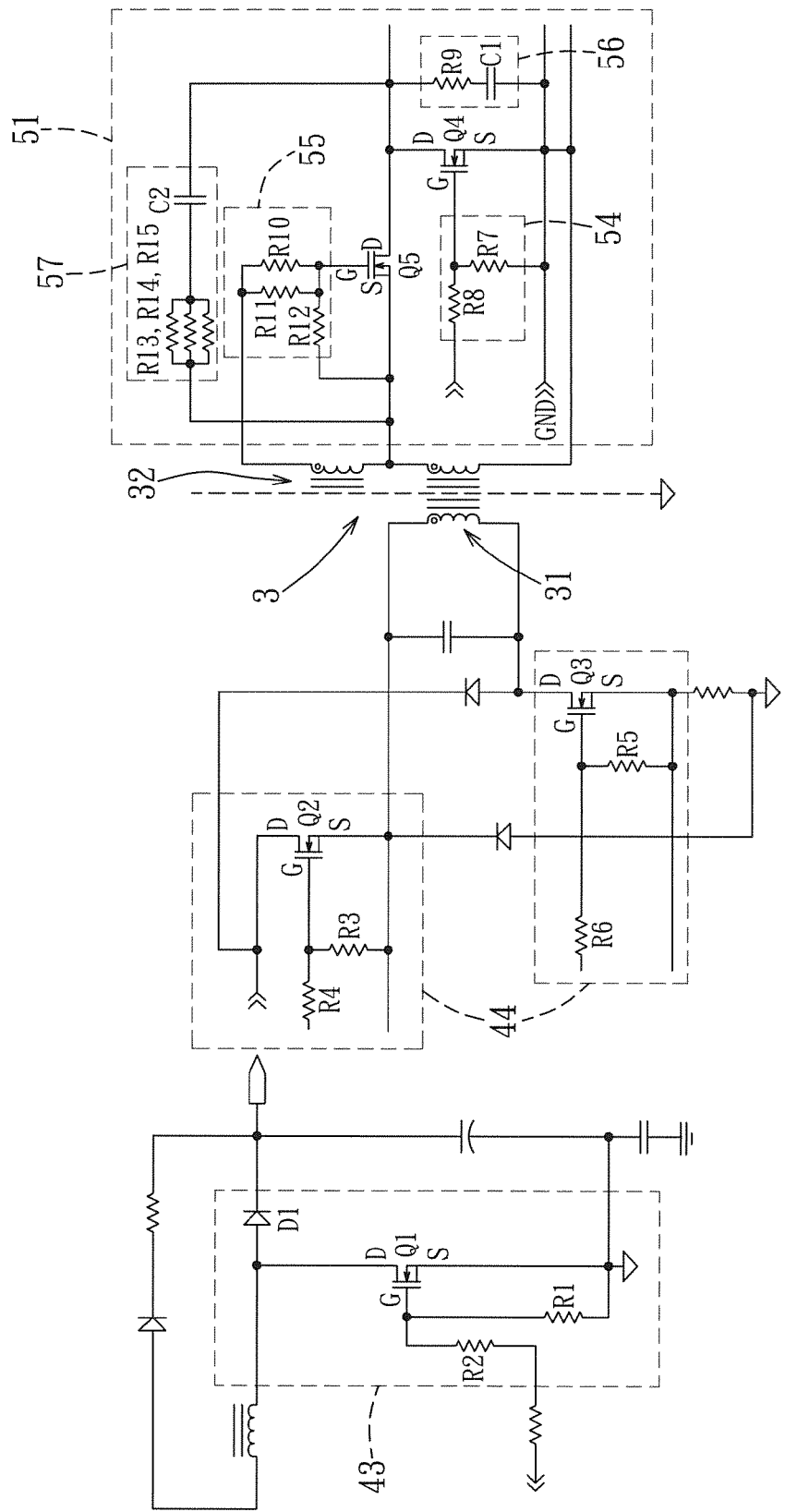
FIG. 3 is a circuit diagram of a step-up circuit, a power switching circuit and a synchronous rectifying circuit of the power supply device according to the preferred embodiment.

As shown in FIG. 3, the step-up circuit 43 includes a first power switching element (Q1), e.g., a metal-oxide semiconductor field effect transistor (MOSFET) having a source terminal (S), a drain terminal (D) and a gate terminal (G), a first diode (D1) whose anode is electrically connected to the drain terminal (D) of the first power switching element (Q1), and a first driving circuit that is electrically connected to the gate terminal (G) of the first power switching element (Q1). The first driving circuit includes a resistor (R1) that is electrically connected between the gate terminal (G) and the source terminal (S) of the first power switching element (Q1), and another resistor (R2) that is electrically connected to the gate terminal (G) of the first power switching element (Q1).

The power switching circuit 44 includes second and third power switching elements (Q2), (Q3), and second and third driving circuits that are electrically and respectively connected to the second and third power switching elements (Q2), (Q3). The second and third power switching elements (Q2), (Q3) are each a MOSFET having a source terminal (S), a drain terminal (D) and a gate terminal (G) in this embodiment. The second driving circuit includes a resistor (R3) that is electrically connected between the gate terminal (G) and the source terminal (5) of the second power switching element (Q2), and another resistor (R4) that is electrically connected to the gate terminal (G) of the second power switching element (Q2). The third driving circuit includes a resistor (R5) that is electrically connected between the gate terminal (G) and the source terminal (S) of the third power switching element (Q3), and another resistor (R6) that is electrically connected to the gate terminal (G) of the third power switching element (Q3).

The synchronous rectifier circuit 51 includes fourth and fifth power switching elements (Q4), (Q5), each of which is a MOSFET having a source terminal (S), a drain terminal (D) and a gate terminal (G) in this embodiment, fourth and fifth driving circuits 54, 55 that are electrically and respectively connected to the gate terminals (G) of the fourth and fifth power switching elements (Q4, Q5), and first and second snubbers 56, 57 each of which is electrically connected between the drain terminal (D) and the source terminal (S) of a corresponding one of the fourth and fifth power switching elements (Q4), (Q5). The fourth driving circuit 54 includes a resistor (R7) that is electrically connected between the gate terminal (G) and the source terminal (S) of the fourth power switching element (Q4), and another resistor (R8) that is electrically connected to the gate terminal (G) of the fourth power switching element (Q4). The first snubber 56 includes a resistor (R9) and a capacitor (C1) that are electrically connected in series between the drain terminal (D) and the source terminal (S) of the fourth power switching element (Q4). The fifth driving circuit 55 includes two parallel-connected resistors (R10), (R11) that are electrically connected to the gate terminal (G) of the fourth power switching element (Q4), and an additional resistor (R12) that is electrically connected between the gate terminal (G) and the source terminal (S) of the fifth power switching element (Q5). The second snubber 57 includes three parallel-connected resistors (R13), (R14), (R15), and a capacitor (C2) connected in series with the parallel-connected resistors (R13), (R14) (R15) between the drain terminal (D) and the source terminal (S) of the fifth power switching element (Q5).

With reference to FIG. 3, in order to facilitate convenient assembly of power switching elements with a primary circuit board of the power supply device 2, and replacements thereof, as well as to facilitate heat dissipation of the power switching elements, the disclosure is designed such that at least one of the power switching elements (Q1) to (Q5) of the power supply device 2 is disposed on a separate printed circuit board (PCB) to form a power switching module (such as a power switching module 100 shown in FIG. 4) or to form a power switching PCB (such as a PCB 6 shown in FIG. 4), while the rest of the components of the power supply device 2 cooperatively form a main unit (such as a main unit 10 shown in FIG. 4) including the primary circuit board. Take FIG. 4 as an example for further illustration, the main unit 10 further includes a socket 20 provided for removable insertion of the power switching module 100. The socket 20 is electrically connected to one of the primary- and secondary-side circuits 4, 5 on the primary circuit board. In addition, the power switching module 100 is formed with a plurality of connection pads 60 and a plurality of conductive tracks 61 for connecting the terminal(s) of said at least one power switching element to the components of the main unit 10 when the power switching module 100 is plugged into the socket 20 of the main unit 10. In this way, the main unit 10 is prevented from overheating and resulting in adverse influences on the components thereof because the heat-generation-prone power switching element(s) is disposed on a separate PCB to form a module separate from the main unit 10. In addition, since the power switching module 100 is in the form of an easily plugged and removed PCB, replacement and maintenance thereof are easy to implement, as compared to the labor-consuming fastening method for assembling the power switching element 11, 12 and the heat dissipating element 15 of the prior art (shown in FIG. 1). In addition, components such as the insulators 16, 17, the screw 13 and the nut are all spared according to the disclosure. Therefore, the disclosure reduces the cost, manpower, and time consumed during manufacturing and maintenance. Alternatively, the power switching module may be in the form of a separate printed circuit board (PCB) that is to be welded to the primary circuit board of the main unit 10, without the use of the socket 20 of the main unit 10 in a manner that the power switching PCB forms a non-zero angle with the primary circuit board of the main unit 10 so as to prevent significant heat transfer from the power switching PCB to the primary circuit board of the main unit 10. Therefore, in the following description, the power switching module 100 is referred to as a PCB, which may either be in the form of a pluggable PCB as shown in FIG. 4, or a weldable PCB.

Figure 4:
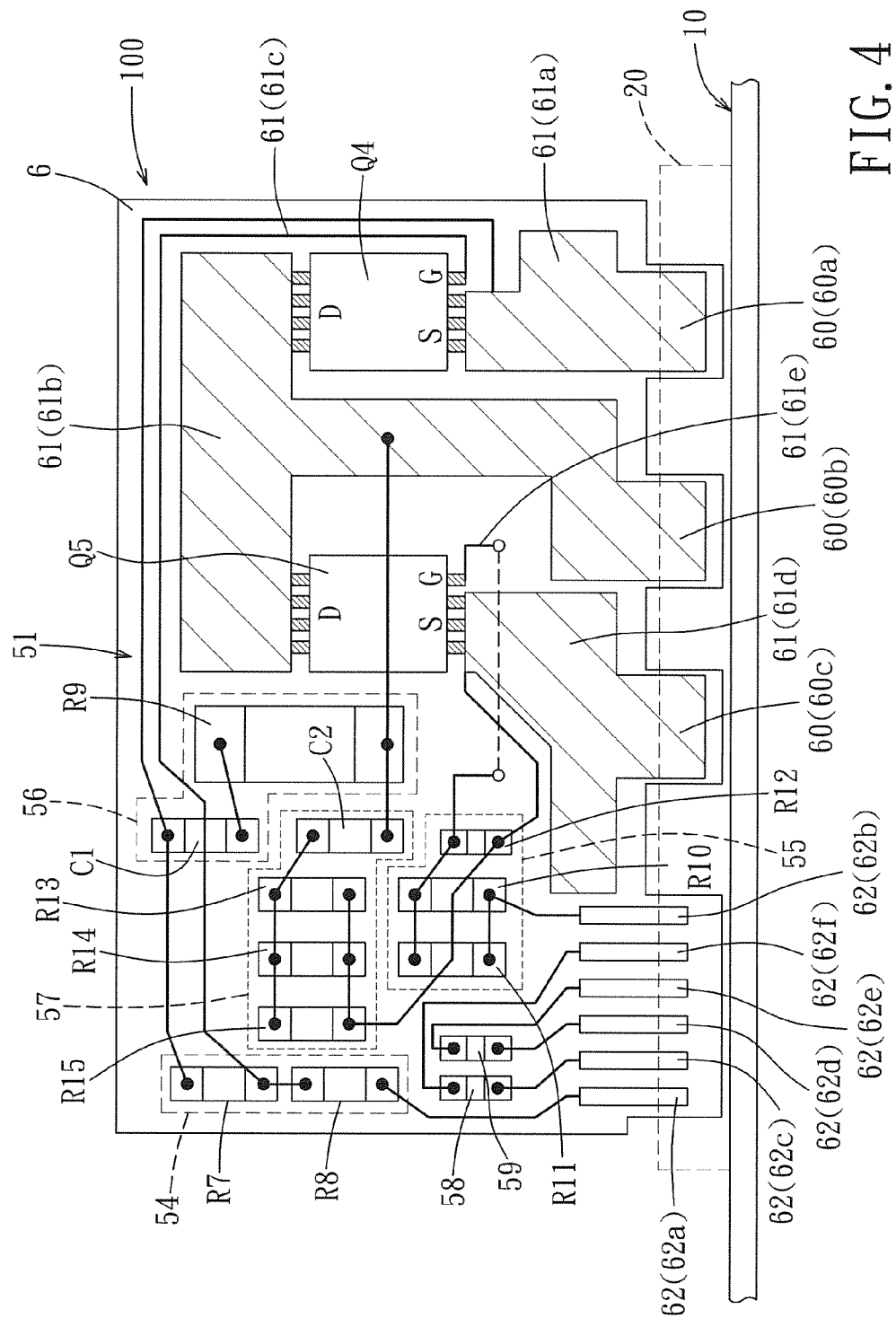
FIG. 4 is a schematic diagram illustrating a first implementation of a power switching module of the power supply device according to the preferred embodiment.

Specifically, in a first implementation shown in FIG. 4, the power switching module 100 is a synchronous rectifier PCB, where the synchronous rectifier circuit 51 of the secondary-side circuit 5 of the power supply device 2 is disposed on a single layer PCB 6, while the other components of the power supply device 2 cooperatively constitute the main unit 10, which in the embodiment shown in FIG. 4 is illustrated to include the socket 20, which is optional. The PCB 6 is formed with three connection pads 60, multiple conductive tracks 61, and six output pins 62 with the connection pads 60 and the output pins 62 disposed at an edge of the PCB 6. The source terminal (S) of the fourth power switching element (Q4) of the synchronous rectifier circuit 51 is electrically connected to the connection pad 60a through the conductive track 61a. The drain terminals (D) of the fourth and fifth power switching elements (Q4), (Q5) of the synchronous rectifier circuit 51 are electrically connected to the connection pad 60b through the conductive track 61b. The gate terminal (G) of the fourth power switching element (Q4) is electrically connected to the fourth driving circuit 54 by the conductive track 61c. The gate terminal (G) of the fifth power switching element (Q5) is electrically connected to the fifth driving circuit 55 by the conductive track 61e. The resistor (R7) of the fourth driving circuit 54 is electrically connected between the gate terminal (G) and the source terminal (S) of the fourth power switching element (Q4), and the resistor (R8) of the fourth driving circuit 54 is electrically connected between the gate terminal (G) of the fourth power switching element (Q4) and the output pin 62a. As described above, the series-connected resistor (R9) and first capacitor (C1) of the first snubber 56 of the synchronous rectifier circuit 51 are electrically connected between the drain terminal (D) and the source terminal (S) of the fourth power switching element (Q4). The source terminal (S) of the fifth power switching element (Q5) is electrically connected to the connection pad 60c through the conductive track 61d. The parallel-connected resistors (R10), (R11) of the fifth driving circuit 55 of the synchronous rectifier circuit 51 are electrically connected between the gate terminal (G) of the fifth power switching element (Q5) and the output pin 62b, and the resistor (R12) of the fifth driving circuit 55 is electrically connected between the gate terminal (G) and the source terminal (S) of the fifth power switching element (Q5). The second snubber 57 of the synchronous rectifier circuit 51 is electrically connected between the source terminal (S) and the drain terminal (D) of the fifth power switching element (Q5), in which the three parallel-connected resistors (R13), (R14), (R15) are connected electrically in series with the capacitor (C2).

Among the multiple conductive tracks 61, three conductive tracks that are connected to drain and source terminals (D), (S) of the fourth and fifth power switching elements (Q4), (Q5), namely 61b, 61a, 61d, are made of large copper foils that are patterned on the PCB 6 in order to facilitate heat dissipation of the fourth and fifth power switching elements (Q4), (Q5). In other words, for heat dissipation purposes, each of the conductive tracks corresponding to the drain and source terminals (D), (S) of said at least one power switching element of the power switching module according to the preferred embodiment of the disclosure is greater in width and surface area than the conductive track corresponding to the gate terminal (G) of said at least one power switching element.

It should be noted that the conductive tracks 61 shown in FIG. 4 are shown schematically for illustration purposes, and in reality, parts of the conductive tracks 61 may be disposed underneath the electric components of the power switching PCB 100.

In this implementation, the power switching PCB 100 further includes two thermal sensors 58, 59 for detecting a temperature of the synchronous rectifier circuit 51. The thermal sensors 58, 59 are connected electrically to the corresponding output pins 62c-62f through the corresponding conductive tracks (not labeled) respectively.

With the power switching PCB 100 designed in the above-described manner, the same can be removably plugged into the socket 20 of the main unit 10 or welded to the main unit 10 for establishing electrical connection with the components of the main unit 10 through the connection pads 60 and the output pins 62 such that the power switching PCB 100 forms a non-zero angle with the main unit 10 so as to prevent significant heat transfer from the power switching PCB 100 to the main unit 10. In this implementation, the power switching module 100 is a synchronous rectifier PCB, and, after being plugged into the socket 20, is electrically connected between the secondary coil 32 of the transformer 3 and the output filter circuit 52 (shown in FIG. 2) of the main unit 10, thereby cooperatively forming the power supply device 2 with the main unit 10. In other words, the socket 20 of the main unit 10 is electrically connected with the secondary coil 32 and the output filter circuit 52 in this case. With the removable feature of the power switching PCB 100 and the feature of dissipating heat through the purposefully enlarged conductive tracks 61, the power switching PCB 100 of the disclosure saves space, manpower, assembly time, and can be replaced conveniently. In this embodiment, the object of heat-dissipating is achieved through the separate single layer PCB 6 and the widened conductive tracks 61. Moreover, the PCB 6 may also be of multiple layers so as to further enhance the heat-dissipating efficiency.

Figure 5:
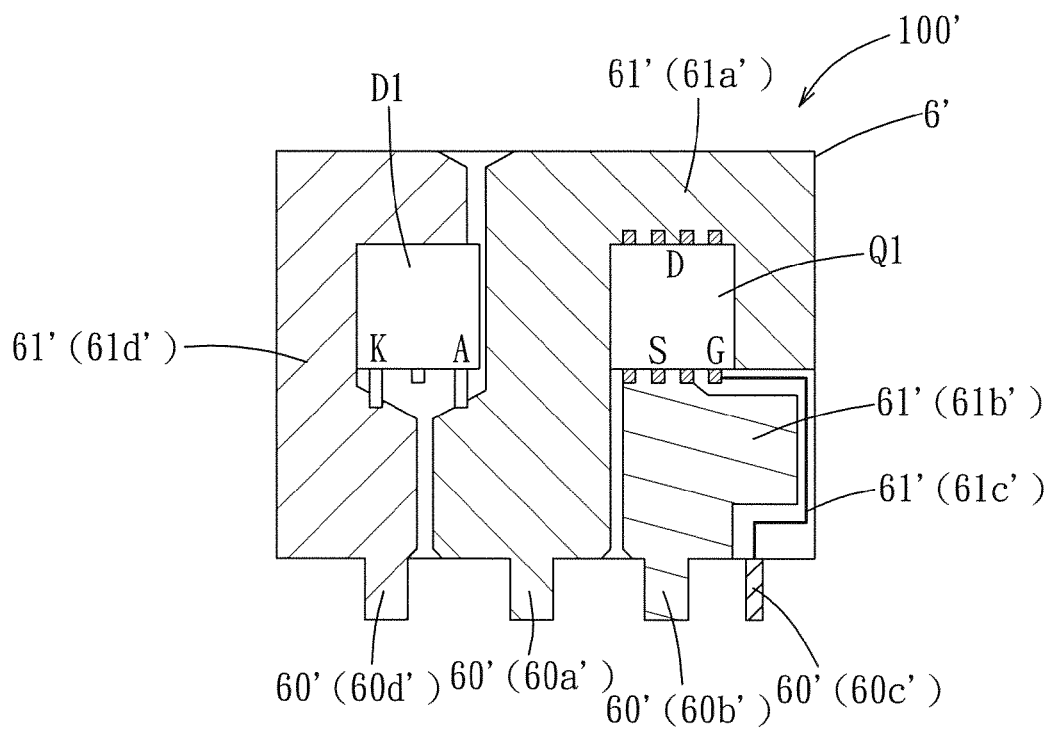
FIG. 5 is a schematic diagram illustrating a second implementation of the power switching module of the power supply device according to the preferred embodiment.

As shown in FIG. 5, in a second implementation of the preferred embodiment, the power switching module 100' is a step-up PCB, in which the step-up circuit 43 of the primary-side circuit 4 of the power supply device 2 includes the first power switching element (Q1) and the first diode (D1) and is disposed on a single layer PCB 6', while the other components of the power supply device 2 cooperatively constitute the main unit 10. The PCB 6' is formed with four connection pads 60' and four conductive tracks 61' with the connection pads 60' disposed at an edge of the PCB 6'. The first diode (D1) of the step-up circuit 43 has an anode (A) and a cathode (K). The drain terminal (D) of the first power switching element (Q1) of the step-up circuit 43, the anode (A) of the first diode (D1) and a first connection pad 60a' are interconnected electrically through a first conductive track 61a'. The source and gate terminals (S), (G) of the first power switching element (Q1) are respectively and electrically coupled to a second connection pad 60b' and a third connection pad 60c' respectively through a second conductive track 61b' and a third conductive track 61c'. The cathode (K) of the first diode (D1) is electrically coupled to a forth connection pad 60d' through a fourth conductive track 61d'. The conductive tracks corresponding to the drain and source terminals (D), (S) of the first power switching element (Q1) and the anode (A) and cathode (K) of the first diode (D1), namely the conductive tracks 61a', 61b', 61d' are made of copper foils of greater width and surface area than the remaining conductive track, i.e., 61c'. Similarly, the step-up PCB 100' can be removably plugged into the socket 20 (shown in FIG. 4) of the main unit 10 (shown in FIG. 4) or be welded to the main unit 10 through the four connection pads 60' for establishing electrical connections with the components of the main unit 10. In this implementation, since the power switching module 100' is a step-up PCB 100', after being plugged into the socket 20, the power switching module 100' is electrically coupled between the bridge rectifier circuit 42 and the power switching circuit 44 (shown in FIG. 2) for outputting, by performing a step-up conversion on the direct-current (DC) pulse voltage generated by the bridge rectifier circuit 42, a stepped-up voltage for subsequent output to the power switching circuit 44.

Figure 6:
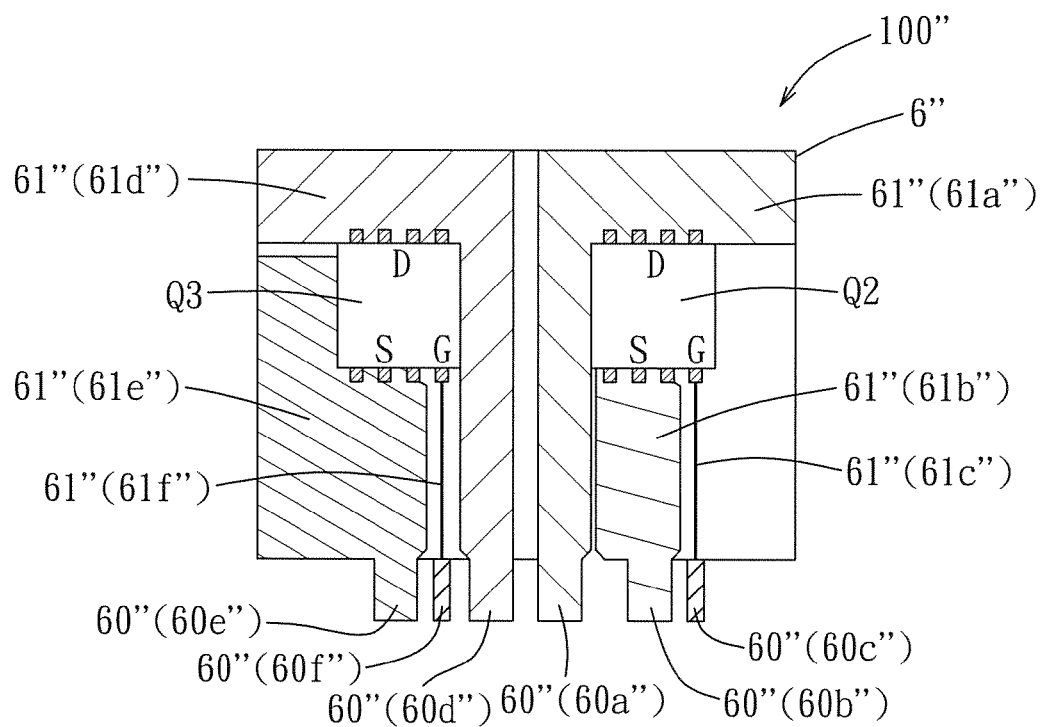
FIG. 6 is a schematic diagram illustrating a third implementation of the power switching module of the power supply device according to the preferred embodiment.

As shown in FIG. 6, in a third implementation of the preferred embodiment, the power switching module 100″ is constituted by disposing the second and third power switching elements (Q2), (Q3) of the power switching circuit 44 of the power supply device 2 on a separate single layer PCB 6″, and is referred hereinafter also as a power switching PCB 100″. The PCB 6″ is formed with six connection pads 60″ disposed at an edge of the PCB 6″, and six conductive tracks 61″. The drain, source and gate terminals (D), (S), (G) of the second power switching element (Q2) are respectively and electrically coupled to three of the connection pads 60a″, 60b″, 60c″ through three of the conductive tracks 61a″, 61b″, 61c″. The drain, source and gate terminals (D), (S), (G) of the third power switching element (Q3) are respectively and electrically coupled to the other three of the connection pads 60d″, 60e″, 60f″ through the other three of the conductive tracks 61d″, 61e″, 61f″. The four conductive tracks 61a″, 61d″, 61b″, 61e″ respectively connected to the drain and source terminals (D), (S) of the second and third power switching elements (Q2), (Q3) are made of copper foils of the PCB 6″ of greater width and surface area for heat dissipation. Similarly, the power switching PCB 100″ can be plugged removably into the socket 20 (shown in FIG. 4) of the main unit 10 (shown in FIG. 4), or welded to the main unit 10 for establishing electrical connections with the components of the main unit 10. In this implementation, after being plugged into the socket 20, the power switching PCB 100″ is electrically coupled between the step-up circuit 43 and the primary coil 31 of the transformer 3 for exiting the primary coil 31 to induce a voltage at the secondary coil 32 of the transformer 3.

It should be noted herein that the power supply device 2 of the preferred embodiment may simultaneously have the power switching modules 100, 100′, 100″ shown respectively in FIG. 4, FIG. 5 and FIG. 6, while the main unit 10 is constituted by the remaining components of the power supply device 2 and three corresponding sockets 20. The connection pads 60, 60′, 60″ and the conductive tracks 61, 61′, 61″ are made of copper foils, and the connection pads 60, 60′, 60″ are exposed for connection, while the conductive tracks 61, 61′, 61″ may be exposed or unexposed.

To sum up, the power supply device of the disclosure is designed to have at least one power switching element that easily generates heat disposed on a separate printed circuit board, which is formed with conductive tracks of large width and surface area, to constitute a power switching module in the form of a PCB, which is removably plugged into a socket of a main unit of the power supply device or alternatively welded to the main unit, so that heat dissipation is provided, and that easy assembly of the power supply device 2 and convenient replacement of the power switching module are facilitated, thereby reducing manufacturing costs and simplifying manufacturing procedures.

While the disclosure has been described in connection with what is considered the most practical and preferred embodiment, it is understood that this disclosure is not limited to the disclosed embodiment but is intended to cover various arrangements included within the spirit and scope of the broadest interpretation and equivalent arrangements.

What is claimed is:

1. A synchronous rectifier printed circuit board (PCB) to be connected to a main unit of a power supply device, the main unit including a transformer that includes a primary coil and a secondary coil, a primary-side circuit electrically coupled to the primary coil, and a secondary-side circuit electrically coupled to the secondary coil, the secondary-side circuit including an output filter circuit capable of filtering out ripples in a direct-current (DC) voltage, said synchronous rectifier PCB comprising:

a printed circuit board;

two power switching elements disposed on said printed circuit board, each of said power switching elements having a source terminal, a gate terminal and a drain terminal;

two driving circuits disposed on said printed circuit board, and electrically and respectively coupled to said gate terminals of said power switching elements; and two snubbers disposed on said printed circuit board, each of said snubbers being electrically coupled between said drain and source terminals of a corresponding one of said power switching elements;

wherein said synchronous rectifier PCB is electrically coupled between the secondary coil of the transformer and the output filter circuit for synchronously rectifying an alternating-current (AC) voltage induced at the secondary coil into a direct-current (DC) voltage to be subsequently outputted to the output filter circuit, and wherein said printed circuit board is formed at an edge with a plurality of connection pads, and is further formed with a plurality of conductive tracks, said drain terminals of said power switching elements being electrically coupled to a first one of said connection pads through a first one of said conductive tracks, said source terminals of said power switching elements being electrically and respectively coupled to a second one and a third one of said connection pads respectively through a second one and a third one of said conductive tracks, said gate terminals of said power switching elements being electrically and respectively coupled with said driving circuits respectively through a fourth one and a fifth one of said conductive tracks, said drain and source terminals of each of said power switching elements being further electrically coupled to a corresponding one of said snubbers.

2. The synchronous rectifier PCB of claim 1, wherein said printed circuit board is a single layer printed circuit board, said conductive tracks being made of copper foils patterned on said printed circuit board, each of said first, second and third ones of said conductive tracks being greater in width and surface area than said fourth and fifth ones of said conductive tracks.

3. The synchronous rectifier PCB of claim 1, wherein said conductive pads are made of copper foils patterned on said printed circuit board.

4. The synchronous rectifier PCB of claim 1, wherein each of said power switching elements is a metal oxide semiconductor field-effect transistor (MOSFET).

5. A synchronous rectifier printed circuit board (PCB) comprising:

a printed circuit board;

two power switching elements disposed on said printed circuit board, each of said power switching elements having a source terminal, a gate terminal and a drain terminal;

two driving circuits disposed on said printed circuit board, and electrically and respectively coupled to said gate terminals of said power switching elements; and two snubbers disposed on said printed circuit board, each of said snubbers being electrically coupled between said drain and source terminals of a corresponding one of said power switching elements, wherein said printed circuit board is formed at an edge with a plurality of connection pads, and is further formed with a plurality of conductive tracks, said drain terminals of said power switching elements being electrically coupled to a first one of said connection pads through a first one of said conductive tracks, said source terminals of said power switching elements being electrically and respectively coupled to a second one and a third one of said connection pads respectively through a second one and a third one of said conductive tracks, said gate terminals of said power switching elements being electrically and respectively coupled with said driving circuits respectively through a fourth one and a fifth one of said conductive tracks, said drain and source terminals of each of said power switching elements being further electrically coupled to a corresponding one of said snubbers, and wherein said conductive tracks and said connection pads are made of copper foils patterned on said printed circuit board.

* * * * *